United States Patent [19]

Ramesh et al.

[11] Patent Number: 4,879,727

[45] Date of Patent: Nov. 7, 1989

[54] ADAPTIVE THRESHOLD SAMPLING CONTROLLER

[75] Inventors: Nallepilli S. Ramesh, San Jose, Calif.; Suresh Cheemalavagu, Austin, Tex.; Anders Erikson, Bandhagen, Sweden

[73] Assignee: Advanced Micro Devices Inc., Sunnyvale, Calif.

[21] Appl. No.: 904,540

[22] Filed: Sep. 5, 1986

[51] Int. Cl.$^4$ .......................................... H04L 25/06
[52] U.S. Cl. ................................ 375/76; 370/110.1; 375/106
[58] Field of Search ........................ 375/76, 95, 106; 370/100, 110.1; 307/352; 328/158

[56] References Cited

U.S. PATENT DOCUMENTS

| | | | |
|---|---|---|---|
| 3,953,674 | 4/1976 | Fletcher | 375/106 |
| 4,124,778 | 11/1978 | Amass | 370/100 |
| 4,719,624 | 1/1988 | Bellisio | 370/100 |

Primary Examiner—Benedict V. Safourek
Attorney, Agent, or Firm—Kenneth B. Solomon; Richard E. Cummins

[57] ABSTRACT

A method of sampling marks on a transmission line and adjusting their peak amplitude to compensate for attenuation of signal strength on the line and of "voltage addition" caused by multiple terminals transmitting on the line. For networks meeting the CCITT I-Series Recommendation, two B-channels and a D-channel are transmitted in frames over the line; the B-channel forming the best basis for threshold adaptation, the D-channel the next best basis and the F-bit preceeding each frame used in the absence of either B- or D-channel signals. Accordingly, a B-bit mark sample is taken if possible, otherwise a D-bit mark sample; or if neither is present an F-bit mark sample; the adaptive threshold preferably being set at 55% of the peak value of the sample. The method is readily implemented as a "state machine" and consequently can be constructed from a programmable logic array.

5 Claims, 3 Drawing Sheets

ADAPTIVE THRESHOLD SAMPLING CONTROLLER

This invention relats to data transmission and, more particularly, to the adaptation of equipment connected to a transmission line to correct for varying signal strength on the line.

BACKGROUND OF THE INVENTION

The Committee Consultative International Telephone and Telegraphique (CCITT) has drafted Standards for Integrated Services Digital Networks (ISDN); the so-called I-Series Recommendations. These Recommendations include provision of two B-channels and a D-channel transmitted in patterns ("frames") of a specified structure. The structure includes a framing "F" signal bit which precedes each frame.

The signals on the B- and D-channels are received in frames at a four-wire interface, or reference point, from a network by one of several terminals (terminal equipment or "TE") connected along a transmission line. Since the signal strength decays with distance along the line, and because the CCITT standards specify fixed threshold signal strengths to represents an active line, the TE's require "adaptation" to compensate for the decaying signal. Besides signal decay on the line, the presence of multiple transmitting terminals on the line results in voltage addition which can effect the amplitude of the signal received by the TE.

Various "adaptive threshold" schemes are known in the prior art to allow a wide dynamic range in the signals present on the transmission line. For instance, sampling of the F-bit signal strength is commonly used. However, because of relaxed noise margin, the signal strength of the F-bit can be as much as 160% of a nominal value and thus the F-bit is not the best indicator of signal strength on which to base adaptation. Other schemes use the D-channel signal strength, but because a number of terminals can simultaneously transmit D-channel data, until a "collision" occurs, D-channel signal strength similarly is not the best basis for adaptation.

SUMMARY OF THE INVENTION

An adaptive threshold technique according to the instant invention utilizes B-channel signal strength for the basis of adaptive thresholding. Because only one terminal on a network transmits, at any one time, on the B-channel, the signal strength received on the B-channel forms a good basis for adaptation. If no B-channel data is received by the terminal, but D-channel data is received, the adaptive threshold technique of the instant invention samples the D-channel signal strength to establish the threshold. If no data is received on either the B- or D-channels, then the technique samples the F-bit for a threshold adaptation. In this manner, sampling of the "mark" in the frame with the least voltage addition effect is used to update the adaptive threshold.

In a preferred embodiment, a switched capacitor filter generates a running measure of the peak values observed in the samples. The threshold is then set to 55% of the peak values observed in the samples.

DETAILED DESCRIPTION OF A PREFERRED EMBODIMENT

Figure 1:
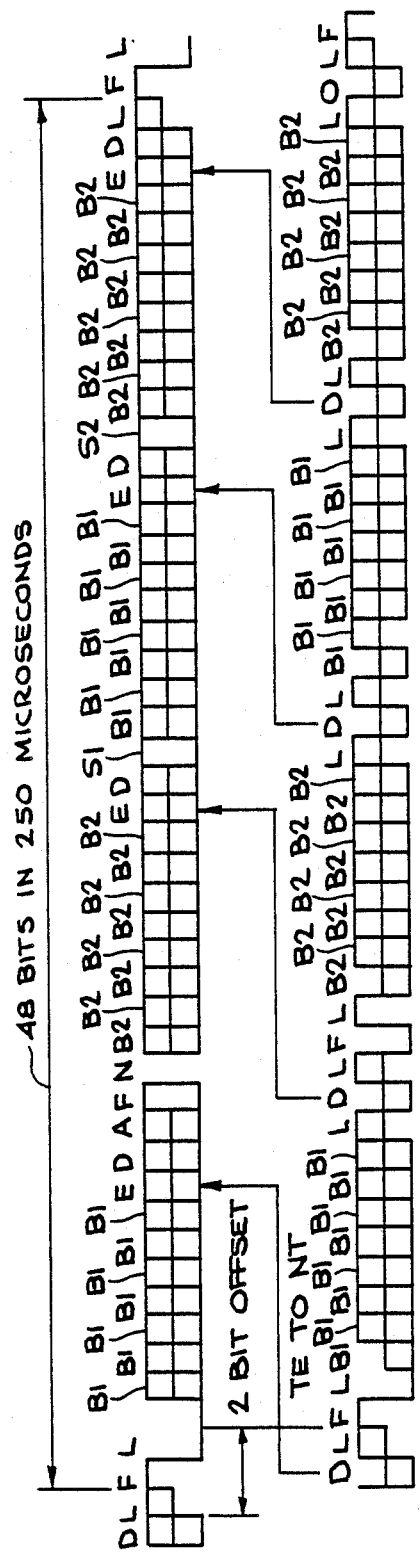
FIG. 1 is a diagram of the frame structure specified in the CCITT I-Series Recommendations.

FIG. 1 is the frame structure used by network termination (NT) and terminal equipment (TE) satisfying the CCITT standards. The upper portion of FIG. 1 illustrates the structure used when transmitting from NT to TE; the lower portion when transmitting from TE to NT. Familiarity with the CCITT "I-Series Recommendations" is important to an understanding of the present invention. These Recommendations are hereby incorporated by reference. With reference to FIG. 1, each frame comprises 48-bit signals occurring in a time interval of 250 microseconds. Of importance to a description of the present invention are the bits denoted "F", "L", "B1" and "B2", and "D", on FIG. 1.

Figure 2:
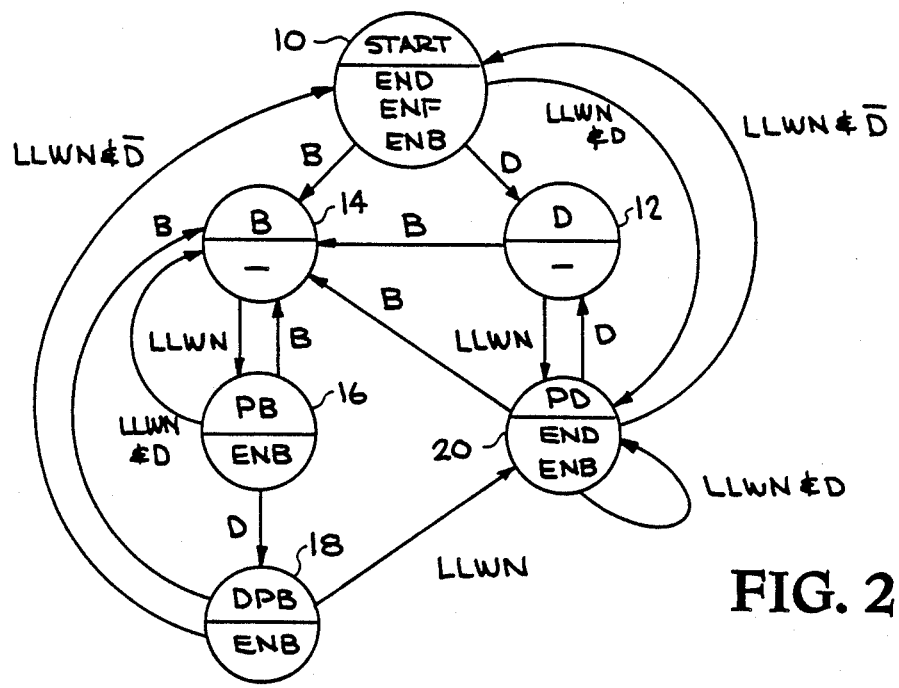
FIG. 2 is a state diagram of an adaptive threshold device according to the present invention.

The adaptive threshold technique of the present invention samples the frames of signals received by a TE or NT. The technique is best described by reference to the state diagram of a Sample Control State Machine (SCSM) of FIG. 2. In the state diagram, each state is represented by a circle. Directed lines between states indicate transitions which occur upon reception of the signal adjacent to the line. The name of each state shown in FIG. 2 is shown in the upper half of the state's circle; a signal generated by the circuit implementing the SCSM is shown in the lower half of the circle. The various signals shown adjacent to the directed lines in FIG. 2 are generated by circuitry receiving the frame shown in FIG. 1, as will be explained in connection with FIGS. 3 and 4, below.

When only F-bits are received, the SCSM is in the START state 10 and an ENF signal (Enable sampling of F-bits), an END signal (Enable sampling of D-bits), and an ENB (Enabling sampling of B-bits) are active. When a high D-bit is received a D-state 12 is entered. If also a high B-bit is received in the same frame a B-state 14 is entered.

At the end of the frame a LLWN (Last L-bit Window) signal goes active and a PB (high B-bit in Previous frame) state 16 is entered wherein only the ENB signal is activated. (If a high D-bit is detected in the next frame it is not used for updating the threshold.) A DPB (high D-bit, high B-bit in previous frame) state 18 is entered upon reception of a high D-bit and the ENB signal is still active. If, however, a high B-bit is detected later in the same frame it is used to update the threshold and the B-state 14 is reentered. If no high B-bit is detected a PD (high D-bit in previous frame) state 20 is entered and the END and ENB signals are activated.

Reception of a high B-bit signal in the DPB-state 18 cause the SCSM to reenter the B-state 14. Reception of the LLWN signal in the B-state 14 causes the SCSM to enter the PB state 16. Reception of the LLWN signal t the DPB state 18 or the D-state 12 causes the SCSM to enter the PD state 20. Reception of the LLWN and high D-bit signals in the PD 20 or START 10 states causes the SCSM to enter the PD state 20; while reception of the LLWN and low D-bit signals in either the DPB 18 or PD 20 states causes the SCSM to enter the START state 10. Reception of the LLWN and low D-bit signal in the PB 16 state causes the SCSM to enter the B 14 state.

Figure 3:
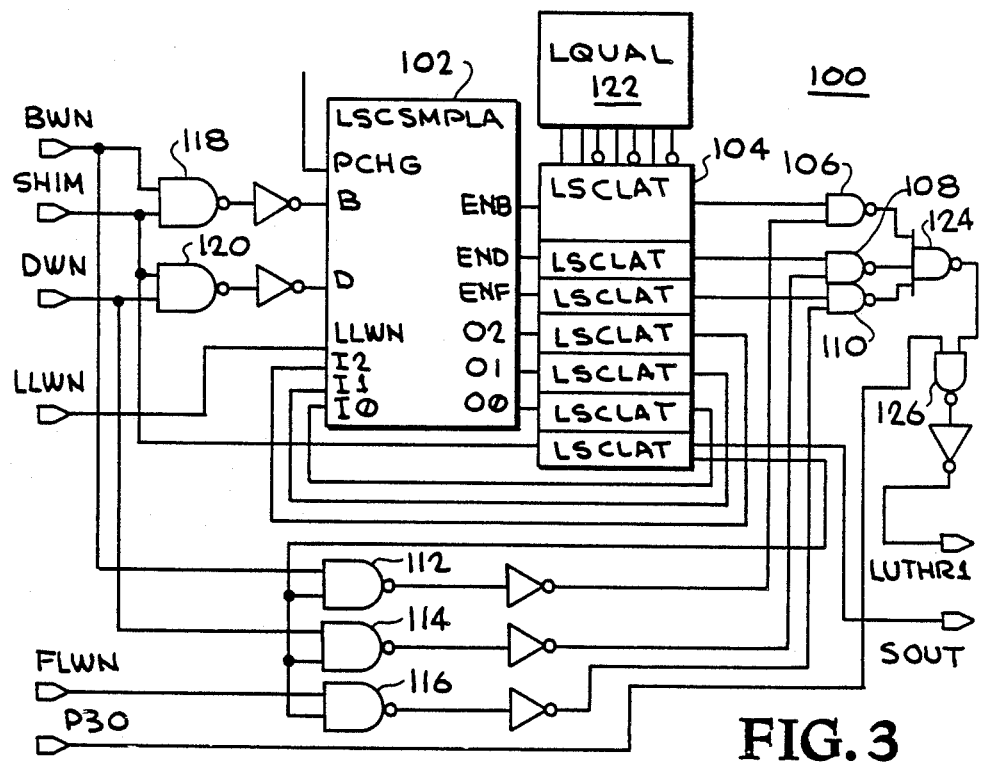
FIG. 3 is a block diagram of an adaptive threshold sample control (ATSC) device according to the present invention.

With reference to FIG. 3, a block diagram of an adaptive threshold sampling control (ATSC) device 100 incorporating the SCSM described above. The combinatorial portion of the SCSM is preferably implemented as a programmable logic array (PLA) 102, as will be appreciated by those skilled in the art, and a set of registers 104 which implement the SCSM state transitions. A set of three input signals I0, I1 and I2 applied to SCSMPLA 102 specify the next-state to be entered and are generated by registers 104; and a set of three output signals 00, 01 and 02 generated by SCSMPLA 102 specifying the current-state are applied to a set of clocked latch 104. The B-bit, D-bit and LLWN signals are also applied to SCSMPLA 102 and the ENB, END and ENF signals generated by SCSMPLA 102 are applied to latchs 104. The ENB, END and ENF signals stored in latches 104 are applied to the first input terminal of NAND gates 106, 108 and 110, respectively. The second input terminal of gates 106, 108 and 110 receive the signals generated by respective AND gates 112, 114 and 116, which in turn receive at a first input terminal the HIMS signal (high mark sample) generated by latch 104. (A SHIM signal—sample high mark—is applied to latch 104). A B-bit window (BWN) signal, a D-bit window (DWN) signal and a first L-bit window (FLWN) signal are applied to a second input terminal of gates 112, 114 and 116, respectfully.

The BWN and DWN signals are applied to a first input terminal of AND gate 118 and 120, respectively, and the SHIM signal is applied to the second input terminal of gates 118 and 120. The signal generated at the output terminal of gates 118 and 120 is the B-bit and D-bit signal, respectively, described above in connection with the state diagram FIG. 2 of the SCSM and are applied to SCSMPLA 102, as is the LLWN signal. A clocked latch qualification (LQUAL) circuit 122 supplies a clock to the set of latches 104.

The signals generated by the NAND gates 106, 108 and 110 are applied to the input terminals of a three-input NAND gate 124, which, in turn, generates therefrom a signal applied to a first input terminal of a NAND gate 126. Gate 126 receives at a second input terminal a P30 signal (representing the thirtyth phase of the 32-phases into which each bit time is subdivided) and generates a sampling clock signal (LUTHR1) at its output terminal.

Figure 4:
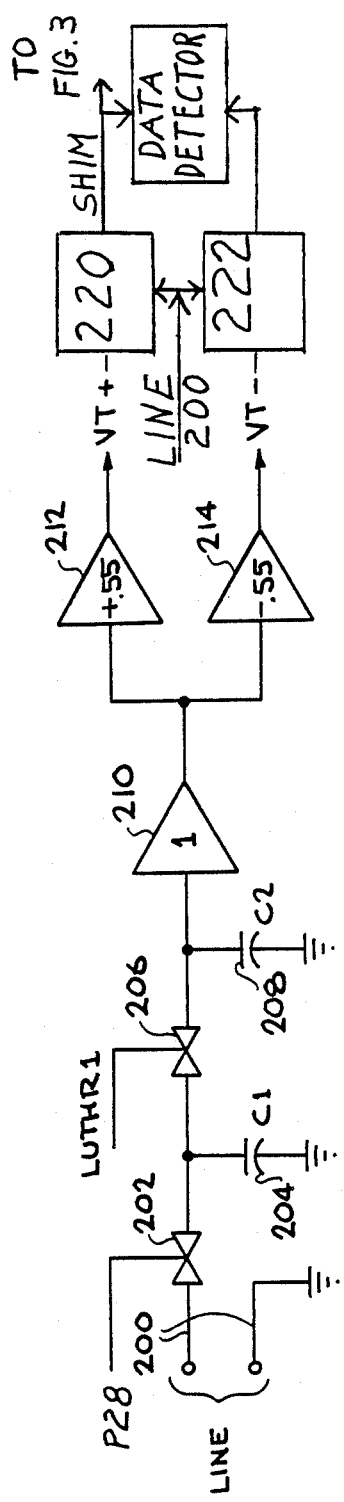
FIG. 4 is a diagram of a portion of the line interface analog adaptive threshold circuitry used in conjunction with the present invention.

A threshold sampling device according to the instant invention is preferably used in conjunction with "line interface" analog adaptive threshold circuitry, a portion of which is shown in FIG. 4. Filtered signals from the transmission line are applied across terminals 200; one terminal of which is grounded, the other terminal is connected to the input terminal of an MOS transmission gate 202, acting as a high-speed switch (S1). Switch 202 receives the P28 (phase 28) of a 192 kbs sampling clock (SMCL1) signal. The output terminal of switch 202 is connected to a first terminal of a sampling capacitor (C1) 204; the second terminal of which is grounded. Also connected to the output terminal of switch 202 is the input terminal of a second MOS transmission gate 206, acting as a high-speed switch (S2). Switch 206 receives LUTHR1 sampling clock signal (designated SMCL2 in FIG. 6) from FIG. 3 generated by the ATSC 100 (FIG. 3).

The output terminal of switch 206 is connected to a first terminal of a storage capacitor (C2) 208; the second terminal of which is grounded. Also connected to the output terminal of switch 206 is a unity gain operational amplifier 210, which acts as a buffer. The output terminal of amplifier 210 is connected to a non-inverting operational amplifier 212 and an inverting oprational amplifier 214, which have gains of 0.55. Amplifiers 212 and 214 generate the theshold voltages which are applied to comparators (not shown) and these threshold voltages are used to detect high, low marks and spaces, as will be appreciated by those skilled in the art.

With reference to FIG. 4, elements 202, 204, 206 and 208 form a switched-capacitor filter. Representing the voltage across terminals 200 at sample time $t_n$ as $V_{LINE}$, the voltage across sampling capacitor (C2) 208 at sample time $t_n$, $V_2$, is given by the equation:

$$V_2(t_n) = \frac{C1 * V_{LINE}(t_n) + C2 * V_2(t_{n-1})}{C1 + C2}$$

The value of $V_2(t_n)$ is taken to represent the peak value on the line. In a preferred embodiment, $C_2 = 20*C_1$, and the value of $V_2(t_n)$ asymptotically approaches the peak voltage values sampled on the line. Accordingly, amplifiers 212 and 214 generate positive and negative threshold voltages, respectively, which represent 55% of these values.

Figure 5:
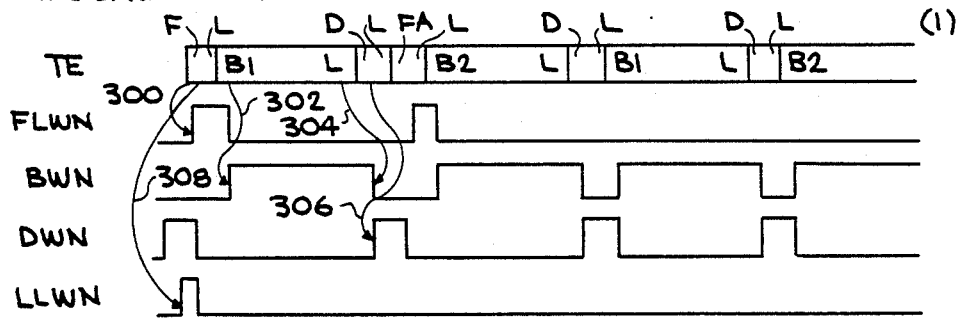
FIG. 5 is a timing diagram showing the four control signals employed by the adaptive threshold device according to the present invention.
Figure 6:
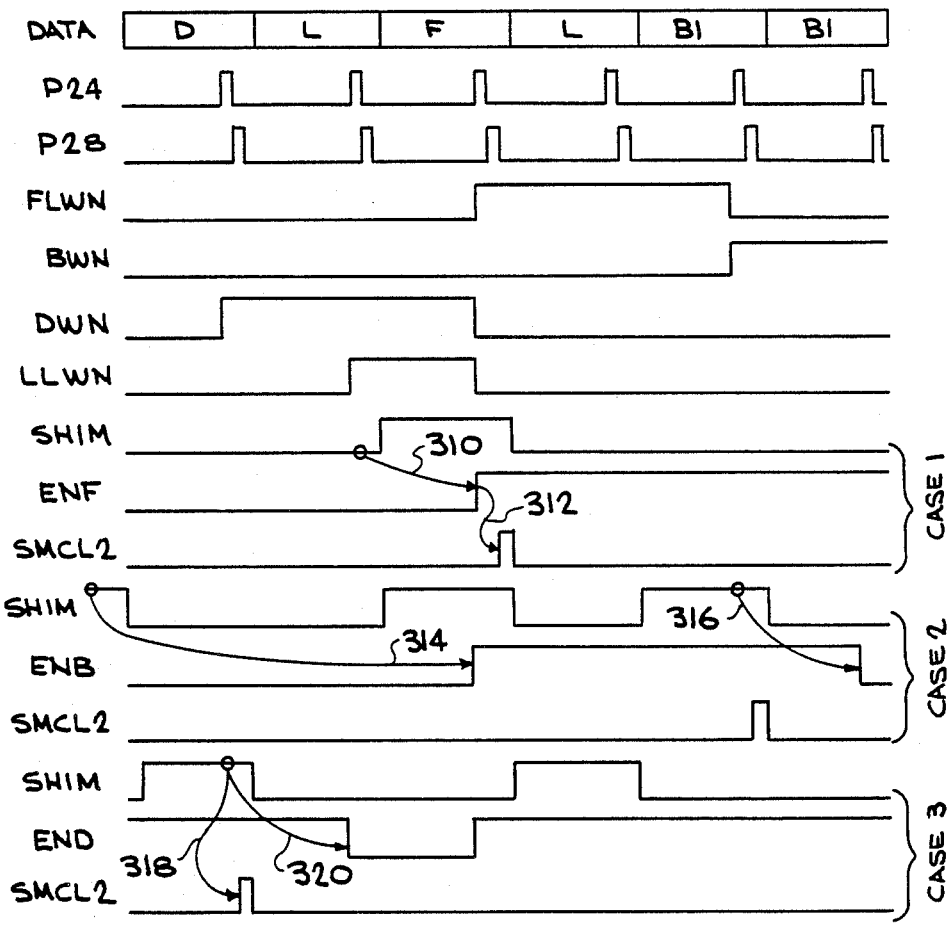
FIG. 6 is a timing diagram showing three cases illustrating operation of the adaptive threshold device of the present invention.

The operation of the SCSM and thus the operation of the adaptive threshold sample control (ATSC) 100 of the present invention is best understood by reference to FIGS. 5 and 6. FIG. 5 identifies the four timing signals used by the ATSC. A first L-bit window (FLWN) timing signal is active (300) during the F-bit and the first L-bit of the frame. A B-bit window (BWN) timing signal is active (302) during the first B-bit slot and inactive (304) following the L-bit slot that follows any B1 or B2 portion of the frame. A D-bit window (DWN) timing signal is active (306) during any D-bit slots andthe L-bit slot that follows a D-bit slot. A last L-bit window (LLWN) timing signal is active (308) during the last L-bit slot of a frame.

With reference to FIG. 6, a timing diagram is presented showing the operation of the ATSC 100 of the present invention. In the upper portion of FIG. 6, the line data is shown together with the P24 and P28 signal phases of the 32-phae intra-bit times, and the FLWN, BWN, DWN and LLWN described in connection with FIG. 5. Three cases are now described which convey the concept employed in the ATSC. In Case 1 no marks have been sampled in the whole previous frame and since no mark is sampled during LLWN (Last L-bit Window) the ENF (Enable F-bit Sampling) signal is activated (310). This leads to the sample clock 2 (SMCL2) hereinbefore designated LUTHR1 being activated (312) for one period so that the sample taken on the high mark in the F-bit with SMCL1 (P28) is transferred to the storage capacitor (208) in the analog adaptive threshold circuit (FIG. 4).

In Case 2 the last bit in the B-channel (the L-bit) is a high mark and the ENB (Enable B-bit sampling) signal is activated (314). At the next high B-mark in the beginning of the next frame a sample is taken and transferred to the storage capacitor (208) whereupon the ENB signal is deactivated (316) so that no more marks are used for updating in that frame. (The first B-bit in a frame is not always high, but this has been assumed here in ordr to simplify the timing diagrams.)

In Case 3 the polarity of the received signal is assumed to be reversed so that the last received D-bit is assumed to be a high mark and the L-bit following the F-bit is also assumed to be a high mark. Here the END (Enable D-bit sampling) signal is active when the last D-bit arrives and the SMCL2 signal is therefore activated (318), whereupon the END signal is deactivated (320). Here it is assumed that no B-bit was active in the previous frame and therefore the END signal is activated also in the next frame.

These three examples, while not exhaustive, describe the general idea of the operation of ATSC 100. If a B-bit was high in the previous frame, the first sample at a high B-bit in the present frame is used to update the adaptive threshold. If a D-bit but no B-bit was high in the previous frame, the first sample of a high D-bit in the present frame is used.

What is claimed is:

1. A method of sampling marks in frames complying with CCITT standards, including B-marks, D-marks and F-marks, to provide continuous frame-to-frame adjustment of a threshold voltage which is employed to detect marks in said frames having peak amplitudes which exceed said threshold voltage, comprising the steps:
    (a) sampling one B-bit mark in a succeeding frame, when a B-bit mark is present in a present frame;
    (b) sampling one D-bit mark in said succeeding frame, when no B-bit mark is present, but a D-bit mark is present in said present frame;
    (c) sampling one F-bit mark in said succeeding frame, when no B-bit and no D-bit marks are present in said present frame; and
    (d) adjusting said threshold voltage to a predetermined proportion of the amplitude of the sample taken in step (a), (b) or (c) to detect high marks in said frame following said succeeding frame.

2. An adaptive threshold sampling method according to claim 1 wherein said frame further includes L-marks and step (b) further includes the step of sampling a low D-bit mark following a high L-bit mark.

3. An adaptive threshold sampling method according to claim 1 wherein said step of adjusting includes the step of adjusting said threshold voltage to approximateLy 55% of the peak amplitude of the sample taken in step (a), (b) or (c).

4. A method of enabling the selective sampling of marks in a sequence of frames complying with CCITT standards to permit frame by frame adjustment of the threshold voltage of a data detector in terminal equipment of a communication system, said frames each having a plurality of bit positions including predetermined bit positions for B-marks, D-marks, F-marks and L-marks, said method comprising the steps of:
    (1) sequentially testing said bit positions in a previous said frame of said sequence,
    (2) enabling the sampling of only B-bit positions in the current said frame when said sequential testing of bit positions in said previous frame produces a high B-bit mark prior to a high D-bit mark,
    (3) enabling the sampling of both B-bit positions and D-bit positions in the current said frame when said sequential testing of bit positions in said previous frame produces a high D-bit mark prior to a high B-bit mark,
    (4) enabling the sampling of only the F-bit position in the current said frame when said sequential testing of bit positions in said previous frame produces no high B-bit marks and no high D-bit marks, and
    (5) buffering the signal strength of the sampled bit position for use in adjusting said threshold voltage.

5. The method recited in claim 4, including the further steps of,
    (5) sequentially testing said bit positions in the current frame concurrently and independently of steps (2), (3) and (4) to selectively enable the sampling of B-bit, D-bit and F-bit marks of the next succeeding frame in said sequence including the steps of,
    (6) enabling the sampling of only B-bit positions in the next succeeding said frame when said sequential testing of bit positions in said current frame produces a high B-bit mark prior to a high D-bit mark,
    (7) enabling the sampling of both B-bit positions and D-bit positions in the next sequential said frame when said sequential testing of bit positions in said current frame produces only a high D-bit mark and no high B-bit mark, provided a high B-bit mark was not produced during the sequential testing of said previous frame, and
    (8) enabling the sampling of the F-bit, B-bit and D-bit positions in the next sequential said frame when said sequential testing of bit positions in said current frame produces no high D-bit marks and provided said sequential testing of said previous frame produced either a high B-bit or a high D-bit.

* * * * *